United States Patent [19]

Frederickson

[11] Patent Number: 4,913,931

[45] Date of Patent: Apr. 3, 1990

[54] METHOD AND SOLUTION FOR THE PREVENTION OF SMEAR IN THE MANUFACTURE OF PRINTED CIRCUIT BOARDS

[76] Inventor: Jeffrey W. Frederickson, 2126 NE. 21st, Portland, Oreg. 97212

[21] Appl. No.: 87,000

[22] Filed: Aug. 18, 1987

[51] Int. Cl.⁴ .............................................. B05D 5/12
[52] U.S. Cl. ..................................... 427/97; 408/704; 427/96
[58] Field of Search ..................... 427/97, 96; 408/704; 106/14.15

[56] References Cited

U.S. PATENT DOCUMENTS

| | | | |
|---|---|---|---|
| 3,778,180 | 12/1973 | Ostrom | 408/704 |
| 4,231,692 | 11/1980 | Brabetz | 408/704 |
| 4,294,729 | 10/1981 | Bakos | 252/170 |
| 4,425,380 | 1/1984 | Nuzzi | 427/97 |
| 4,444,802 | 4/1984 | Winters | 106/14.15 |
| 4,474,619 | 10/1984 | Meyer | 252/61 |
| 4,519,732 | 5/1985 | Sutcliffe | 408/56 |
| 4,790,912 | 12/1988 | Holtzman | 427/305 |

FOREIGN PATENT DOCUMENTS

| | | | |
|---|---|---|---|
| 54610 | 3/1987 | Japan. | |
| 396196 | 1/1974 | U.S.S.R. | 408/56 |

OTHER PUBLICATIONS

Clyde F. Coombs, Jr., "Printed Circuits Handbook" McGraw-Hill, pp. 22-8 through 22-13
Peter E. Kukanskis, "Improved Smear Removal" Circuit Manufacturing, Mar. 1983, pp. 73-74.
John Davey, "Plasma Desmearing" Finishing Industries, Aug. 1981, pp. 33-34.
"Sulfuric Acid Etchback Systems," John W. Burkitt, Printed Circuit Fabrication, Dec. 1980.
"A Scientific Approach to Etchback," D. R. Witherell, publication date unknown.
"Epoxy Smear Not Inevitable," Circuits Manufacturing, publication date unknown.

Primary Examiner—Shrive Beck
Assistant Examiner—Vi Duong Dang
Attorney, Agent, or Firm—Chernoff, Vilhauer, McClung & Stenzel

[57] ABSTRACT

A solution and a method of using it for preventing smear in the manufacture of printed circuit boards includes monoethanolamine combined with a fatty acid for neutralizing the active amine except in the presence of relatively high heat, and a surface tension reducing agent. The solution is applied to the printed circuit board as holes are being drilled. The friction of the drill bit on the printed circuit board generates heat which activates the amine allowing it to attack the inner glass epoxy walls of the printed circuit board and prevent smear.

13 Claims, 1 Drawing Sheet

METHOD AND SOLUTION FOR THE PREVENTION OF SMEAR IN THE MANUFACTURE OF PRINTED CIRCUIT BOARDS

BACKGROUND OF THE INVENTION

The following invention relates to a solution and a method of using that solution for treating printed circuit boards to prevent smear in the manufacture thereof.

During the manufacture of printed circuit ducting copper layers sandwiching a glass epoxy layer, holes are drilled which are then electroplated to create a circuit path from one copper layer to the other In multi-layer boards there can be intermediate copper layers as well. When these holes are drilled, a phenomenon known as "smear" may result Smear is a dielectric material which is deposited on the inner surfaces of the holes made by the drill. The smeared inner walls of the drilled-out holes resist electroplating or the electroless deposit of copper and the smeared material may also effectively cover inner copper conductive layers in multi-layer boards creating a void such that no electrical contact is made between the inner walls of the hole and the inner conductive layers.

Smear is an industry-wide problem in the manufacture of printed circuit boards, and many approaches have been suggested as solutions The most common approach, called "etchback", is to attempt to remove the smear after the holes have been drilled Smear removal generally takes the form of immersing the boards in a strong sulfuric acid bath to roughen or remove the smear and then subsequently rinsing the boards. This approach is expensive and leads to other problems such as residues left by the sulfuric acid which also interfere with the electroplating of the printed circuit board holes. Other approaches use chemicals other than sulfuric acid; nevertheless in these processes, it is necessary to treat the board after the holes have been drilled and then to rinse the treatment chemical away. The rinsing step, in particular, may be extremely time consuming and the equipment needed for post drilling treatment of the boards for any type of smear removal process is very expensive.

SUMMARY OF THE INVENTION

The present invention is a solution, and a method of using the solution, which prevents smear from forming as the holes are being drilled. According to the invention, the holes are drilled in the presence of a solution containing an active amine which, when heated by the friction of the drill bit going through the board, causes the amine to attack and remove smear as it is being generated.

The board is drilled as the solution is applied directly to the holes by way of immersing the board in a bath or applying the solution in a spray or jet in the area of the drilling.

The solution used for treating the boards in this way comprises monoethanolamine, a fatty acid for inhibiting the corrosive effect of the amine, except in the presence of heat created by the friction of the drill bit, and an alcohol to reduce surface tension. A solution may be prepared consisting of 10% monoethanolamine, 6% oleic acid, and 1% amyl alcohol with the balance of the solution being water. The amyl alcohol reduces the surface tension of the solution so that it may easily penetrate the holes as they are being drilled. The oleic acid inhibits the corrosive effect of the monoethanolamine and keeps it from attacking the other portions of the board except in the presence of heat. Due to the high temperatures created by the friction of the drill bit going through the board, the monoethanolamine overcomes the inhibiting effect of the oleic acid and becomes very active, treating the inner walls of the hole as the drill bit goes through. Because no heat is generated in any other portion of the board, the amine remains neutral, inhibited by the oleic acid, and does not corrode or pit other portions of the board. Since smear is prevented during the drilling operation, the necessity for expensive post drilling smear removal methods is obviated.

It is a primary object of this invention to provide a solution and method for the prevention of smear in printed circuit boards.

A further object of this invention is to provide a solution which can be used to treat printed circuit boards during a drilling operation which will actively prevent smear in the region of the hole as it is being drilled without damaging the remainder of the board.

Yet a further object of this invention is to provide a smear prevention method which can be readily adapted to existing circuit board drilling machines without undue expense.

The foregoing and other objectives, features and advantages of the present invention will be more readily understood upon consideration of the following detailed description of the invention taken in conjunction with the accompanying drawings.

DETAILED DESCRIPTION OF THE INVENTION

Figure 1:
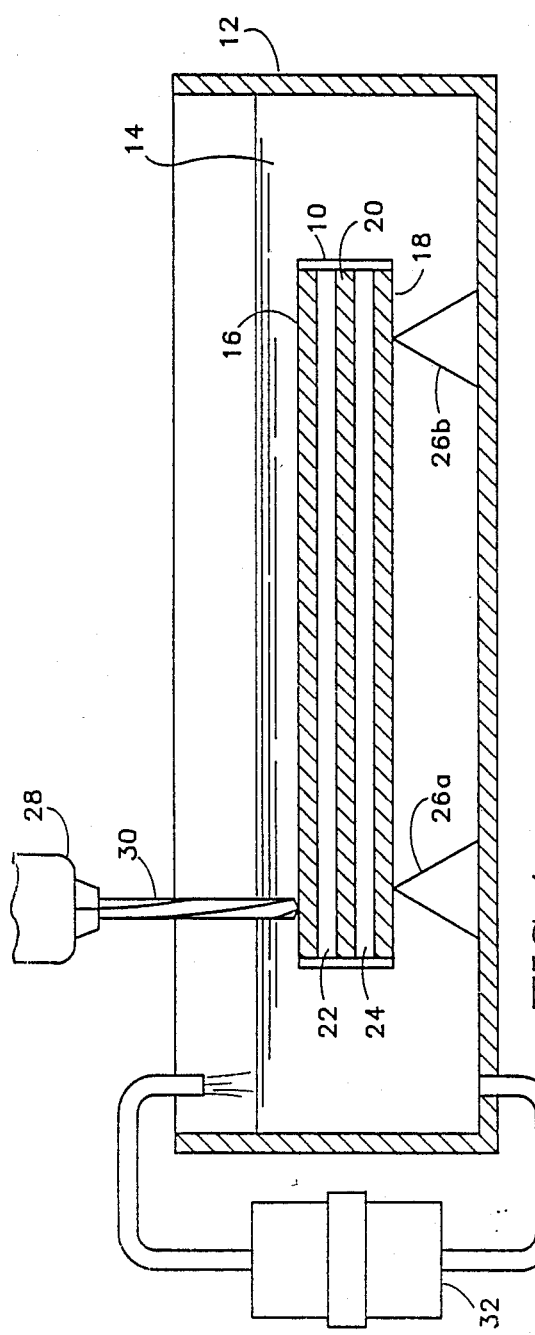
FIG. 1 is a side view of an apparatus for treating a printed circuit board with the solution of the invention while a drilling operation takes place.

A multi-layer printed circuit board 10 is supported within a shallow container or pan 12 which contains a solution 14 comprising approximately 10% monoethanolamine, 6% oleic acid, 1% amyl alcohol and the balance in water. The multilayer circuit board 10 includes an upper layer of copper 16, a lower layer of copper 18 and a middle copper layer 20 sandwiched between layers of glass epoxy 22 and 24, respectively. The printed circuit board 10 is suspended within the bath 14 by supports 26a and 26b, and is held on the supports within the solution 14 so that the upper copper layer 16 is barely submerged. A drill 28 having a drill bit 30 can then be used to drill the required holes (not shown).

The solution 14, although containing an active amine, is neutralized by the oleic acid except in the presence of heat. Heat, however, is generated by the drill bit 30 as it makes contact with the printed circuit board 10. When this occurs the monoethanolamine becomes very active and overcomes the neutralizing effect of the oleic acid. Thus, in the region of the hole thus being formed, the monoethanolamine attacks the glass epoxy as the hole is being drilled and prevents smear from forming.

The solution 14 may be recirculated by a pump 32 which may include a filter (not shown) for removing particles, burrs and the like.

Figure 2:
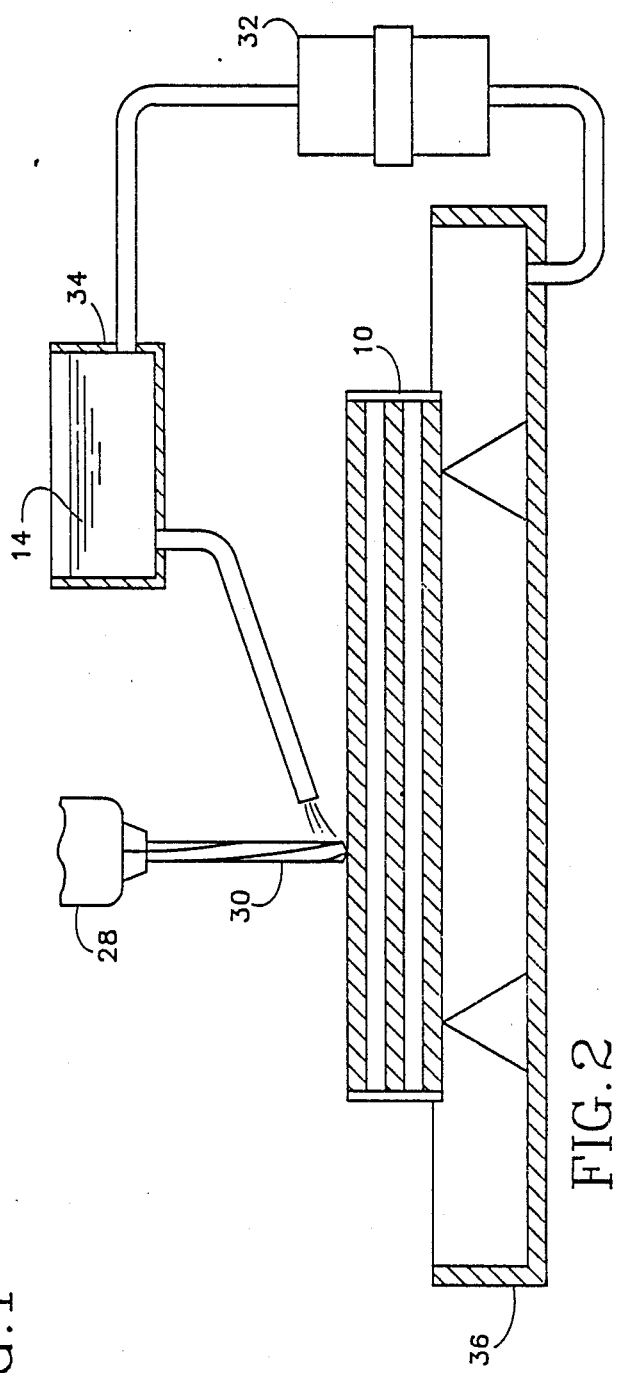
FIG. 2 is a side view of an alternate apparatus for applying the solution of the invention to a printed circuit board while the drilling operation takes place.

An alternative design is shown in FIG. 2 in which a reservoir 34 includes a solution 14 having the composition described above. The solution is sprayed on the printed circuit board 10 in the area engaged by the drill bit 30. A shallow pan 36 may be used to collect the run-off of the solution 14 and it may be recirculated back to the reservoir 34 with pump 32.

It will occur to one of ordinary skill in the art that other methods could be employed for applying the solution to the areas being drilled simultaneously with the drilling operation. What is important, however, is that the solution be applied in such a manner that it enters the hole being formed by the drill. When this occurs the heat of the drill bit will activate the monoethanolamine which will allow it to prevent smear from forming. Another useful side effect of the solution 14 is that it cleans the hole as it is drilled, removing burrs, particles and other matter that often remains in the hole after the drilling operation. This helps to obviate the need for a series of post drilling treatment steps.

The solution, as mentioned above, comprises monoethanolamine, oleic acid, amyl alcohol and water. The oleic acid is a fatty acid which keeps the monoethanolamine neutral except in the presence of high heat, at which it becomes very active. Other fatty acids, however, may have the same effect and it is not necessary that oleic acid be used exclusively. The amyl alcohol is an agent which reduces the surface tension of the solution thus permitting it to enter the relatively small holes formed by the drill bit 30. Other alcohols, however, will also perform this function. The monoethanolamine works best with printed circuit boards comprising layers of copper sandwiching a glass epoxy layers. Other active amines, however, may work better with other printed circuit board materials. The proportions may also be varied to fit the particular circumstances of the drilling operation. In particular, the amount of alcohol is dictated by the overall viscosity of the solution; the more viscous the solution the more alcohol is needed. The relative proportions of the active amine and the fatty acid are dictated in part by the materials of the printed circuit board and also in part by the amount of heat generated by the drill bit.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A method of drilling holes in a printed circuit board which prevents the formation of smear comprising the steps of mounting the printed circuit board in a drilling jig and drilling the printed circuit board in the presence of an aqueous smear preventing solution containing an active amine which wets the interior walls of the holes in the printed circuit board as they are being drilled.

2. The method of claim 1 wherein said active amine is monoethanolamine.

3. The method of claim 2 wherein said solution further includes a fatty acid for neutralizing the monoethanolamine except in the presence of heat generated by the drill bit.

4. The method of claim 3 wherein said solution further includes a surface tension reducing agent.

5. The method of claim 4 wherein said surface tension reducing agent is an alcohol.

6. The method of claim 5 wherein said alcohol is amyl alcohol.

7. The method of claim 3 wherein said solution is provided in the form of a jet or spray directed into the region of the printed circuit board where a hole is to be drilled.

8. The method of claim 3 wherein said fatty acid is oleic acid.

9. A method of reducing the formation of smear in the drilling of a printed circuit board comprising the steps of mounting the printed circuit board in the drilling jig and directing a spray or jet containing an aqueous smear reducing solution containing an active amine at a location on the printed circuit board where a hole is to be drilled by a drill bit as the drill bit engages the printed circuit board.

10. The method of claim 9 wherein the active amine is monoethanolamine.

11. THe method of claim 10 wherein the solution further comprises a fatty acid.

12. The method of claim 11 wherein the solution further comprises a surface tension reducing agent.

13. The method of claim 12 wherein the surface tension reducing agent is an alcohol.

* * * * *

UNITED STATES PATENT AND TRADEMARK OFFICE
CERTIFICATE OF CORRECTION

PATENT NO. : 4,913,931
DATED : April 3, 1990
INVENTOR(S) : Jeffrey W. Frederickson It is certified that error appears in the above-identified patent and that said Letters Patent is hereby corrected as shown below:

Col. 1, Line 10: Insert after "circuit" --boards made of a glass epoxy having top and bottom con--
Col. 1, Line 13: After "other" insert --,--
Col. 1, Line 16: After "result" insert --,--
Col. 1, Line 27: After "solutions" insert --,--
Col. 1, Line 29: After "drilled" insert --,--
Col. 1, Line 35: Delete "electroplating of" and insert --electroless desposit of copper in--
Col. 4, Line 41: Change "THe" to --The--

Signed and Sealed this

Eighteenth Day of February, 1992

*Attest:*

HARRY F. MANBECK, JR.

*Attesting Officer*   Commissioner of Patents and Trademarks